(12) United States Patent
Huang et al.

(10) Patent No.: US 11,323,082 B2
(45) Date of Patent: May 3, 2022

(54) CLASS-D AMPLIFIER WHICH CAN SUPPRESS DIFFERENTIAL MODE POWER NOISE

(71) Applicant: Elite Semiconductor Microelectronics Technology Inc., Hsinchu (TW)

(72) Inventors: Yang-Jing Huang, Hsinchu (TW); Shao-Ming Sun, Hsinchu (TW); Jhe-Jia Jhang, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 0 days.

(21) Appl. No.: 16/988,727

(22) Filed: Aug. 10, 2020

(65) Prior Publication Data

US 2022/0045655 A1    Feb. 10, 2022

(51) Int. Cl.
| | |
|---|---|
| *H03F 3/217* | (2006.01) |
| *H03F 1/26* | (2006.01) |
| *H03F 3/187* | (2006.01) |
| *H03F 3/45* | (2006.01) |

(52) U.S. Cl.
CPC .............. *H03F 3/217* (2013.01); *H03F 1/26* (2013.01); *H03F 3/187* (2013.01); *H03F 2200/351* (2013.01)

(58) Field of Classification Search
CPC . H03F 3/217; H03F 1/26; H03F 3/187; H03F 2200/351
USPC ........................................ 330/10, 207 A, 251
See application file for complete search history.

(56) References Cited

U.S. PATENT DOCUMENTS

| | | | |
|---|---|---|---|
| 10,972,061 B2* | 4/2021 | He ......................... | H03F 3/2175 |
| 2012/0001659 A1 | 1/2012 | Balmelli | |
| 2017/0077882 A1 | 3/2017 | Wang | |

\* cited by examiner

*Primary Examiner* — Hieu P Nguyen
(74) *Attorney, Agent, or Firm* — Winston Hsu

(57) ABSTRACT

A class-D amplifier configured to adjust at least one input signal to at least one output signal. The class-D amplifier comprises: a loop filter, configured to receive the input signal; a PWM circuit, configured to generate at least one PWM signal; a summing circuit, coupled between an output of the loop filter and an input of the PWM circuit; an output circuit operating at a supply voltage, configured to generate the output signal responding to the PWM signal; and a supply voltage filter, configured to monitor the supply voltage to generate a filtered signal to the summing circuit. The summing circuit is configured to sum the output of the loop filter and the filtered signal to adjust a common-mode level of the input of the PWM circuit.

8 Claims, 9 Drawing Sheets

CLASS-D AMPLIFIER WHICH CAN SUPPRESS DIFFERENTIAL MODE POWER NOISE

BACKGROUND OF THE INVENTION

1. Field of the Invention

The present invention relates to a class-D amplifier, and particularly relates to a class-D amplifier which can suppress differential mode power noise.

2. Description of the Prior Art

Conventionally, a class-D amplifier may have differential mode power noise and common mode power noise. In some cases, the common mode power noise may contribute to the differential mode power noise by feedback path mismatch.

However, improving matching of the feedback path requires additional and large silicon area. Therefore, there is a need for a design with high power-supply rejection ratio (PRSS) for high performance of the class-D amplifier.

SUMMARY OF THE INVENTION

One objective of the present invention is to provide a class-D amplifier which can reduce the differential mode power noise without adjusting the matching of the feedback path.

One embodiment of the present invention discloses a class-D amplifier configured to adjust at least one input signal to at least one output signal. The class-D amplifier comprises: a loop filter, configured to receive the input signal; a PWM circuit, configured to generate at least one PWM signal; a summing circuit, coupled between an output of the loop filter and an input of the PWM circuit; an output circuit operating at a supply voltage, configured to generate the output signal responding to the PWM signal; and a supply voltage filter, configured to monitor the supply voltage to generate a filtered signal to the summing circuit. The summing circuit is configured to sum the output of the loop filter and the filtered signal to adjust a common mode level of the input of the PWM circuit.

Another embodiment of the present invention discloses a class-D amplifier configured to adjust at least one input signal to at least one output signal. The class-D amplifier comprises: a loop filter, configured to receive the input signal; a PWM circuit, coupled to the loop filter and configured to generate at least one PWM signal responding to a triangular wave signal; an output circuit operating at a supply voltage, configured to generate the output signal responding to the PWM signal; a supply voltage filter, configured to monitor the supply voltage to generate a filtered signal; and a triangular wave adjusting circuit, configured to adjust a common mode level of the triangular wave signal corresponding to the filtered signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
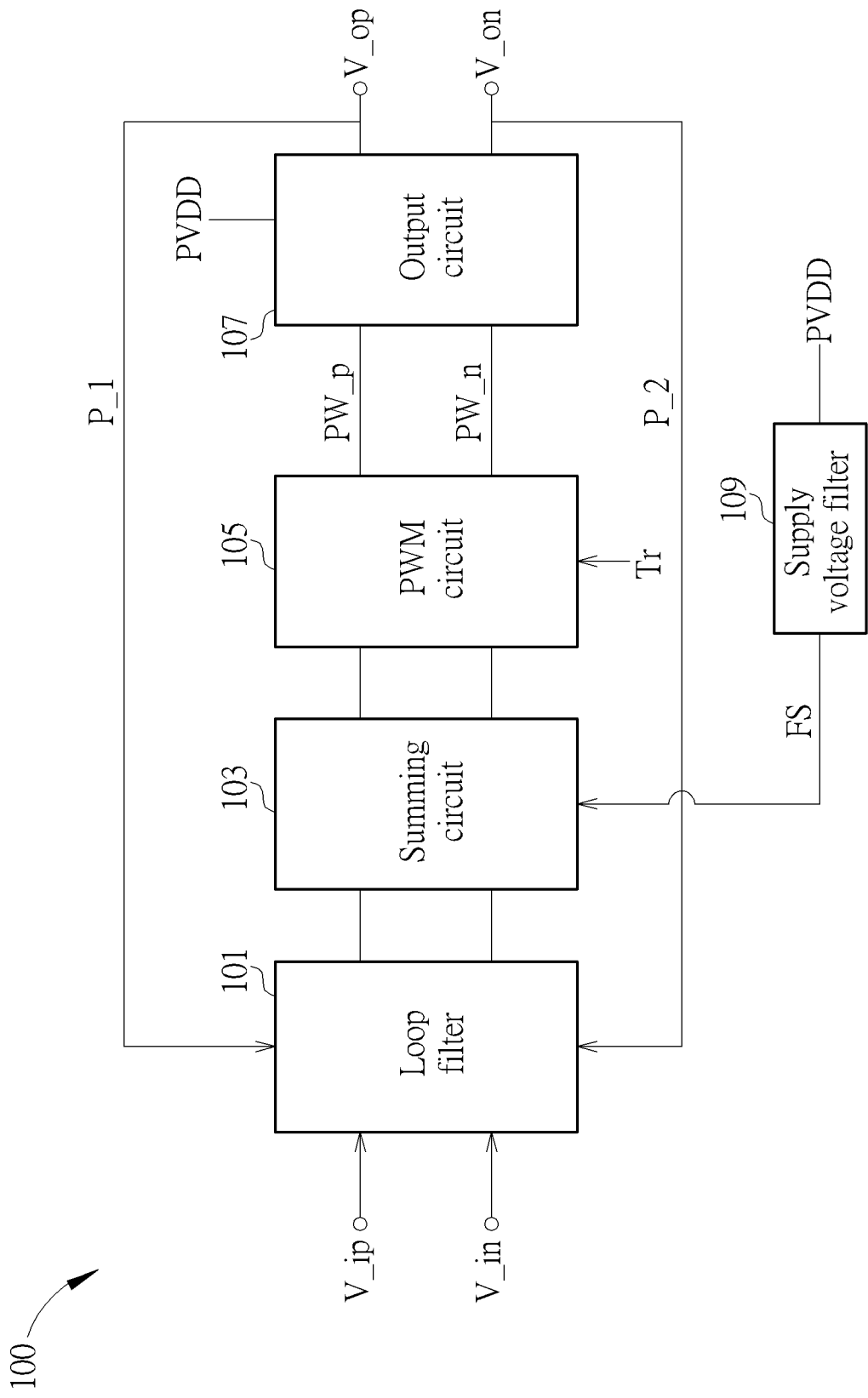
FIG. 1 is a block diagram illustrating a class-D amplifier according to one embodiment of the present invention.

FIG. 1 is a block diagram illustrating a class-D amplifier 100 according to one embodiment of the present invention. As illustrated in FIG. 1, the class-D amplifier 100 is for adjusting (e.g. amplifying) input signals V_ip, V_in to output signals V_op, V_on, and comprises a loop filter 101, a summing circuit 103, a PWM circuit 105, an output circuit 107 and a supply voltage filter 109. Further, the class-D amplifier 100 comprises feedback paths P_1 and P_2 located between the input of the loop filter 101 and the output of the output circuit 107.

The loop filter 101 is configured to receive and filter the input signals V_ip, V_in. The summing circuit 103, which is coupled between an output of the loop filter 101 and an input of the PWM circuit 105, is configured to sum the output of the loop filter 101 and the filtered signal FS from the supply voltage filter 109 to adjust a common-mode level of the input signal of the PWM circuit 105 (i.e., an average voltage of the voltage swing of the input signal). The PWM circuit 105 is configured to modulate outputs from the summing circuit 103 to PWM signals PW_p and PW_n responding to a triangular wave signal Tr. The output circuit 107, which operates at a supply voltage PVDD, is configured to generate the output signals V_op, V_on according to the PWM signals PW_p and PW_n. The supply voltage filter 109 is configured to monitor the supply voltage PVDD to generate the filtered signal FS to the summing circuit 103. Please note, besides, the output circuit 107, and/or the PWM circuit 105 can also operate at the supply voltage PVDD.

Figure 2:
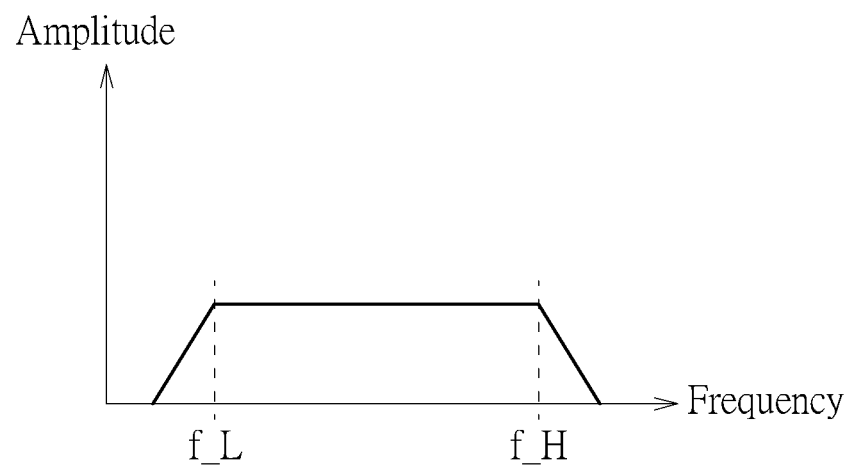
FIG. 2 is a schematic diagram illustrating the operation of the supply voltage filter of FIG. 1 according to one embodiment of the present invention.

The supply voltage filter 109 can be a band pass filter, as shown in FIG. 2. In one embodiment, the low pass cutoff frequency f_L of the supply voltage filter 109 is lower than or equals an audio signal frequency (e.g. 20 Hz). Also, in one embodiment, a high pass cutoff frequency f_H of the supply voltage filter 109 depends on a modulation frequency of the PWM circuit 107. For example, the PWM circuit 107 modulates the output of the summing circuit 103 to the PWM signals PW_p and PW_n responding to a clock signal having a modulation frequency fc, and the high pass cutoff frequency f_H is smaller than or equals $$\frac{fc}{10}.$$

That is, the high pass cutoff frequency f_H may be $$\frac{fc}{N},$$

N is a positive integer.

Figure 3:
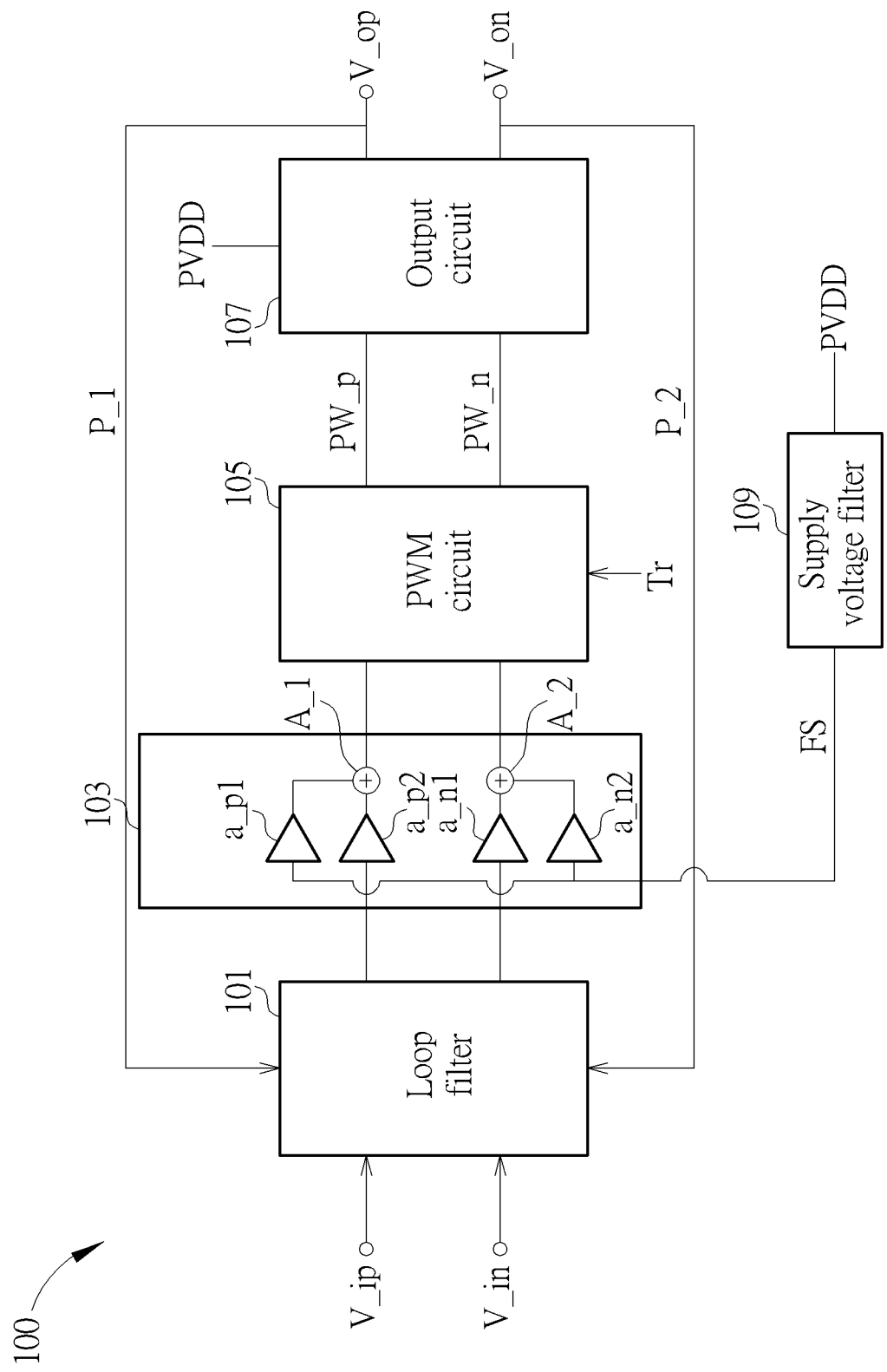
FIG. 3 and FIG. 4 are detail circuit diagrams of the class-D amplifier of FIG. 1, according to different embodiments of the present invention.
Figure 4:
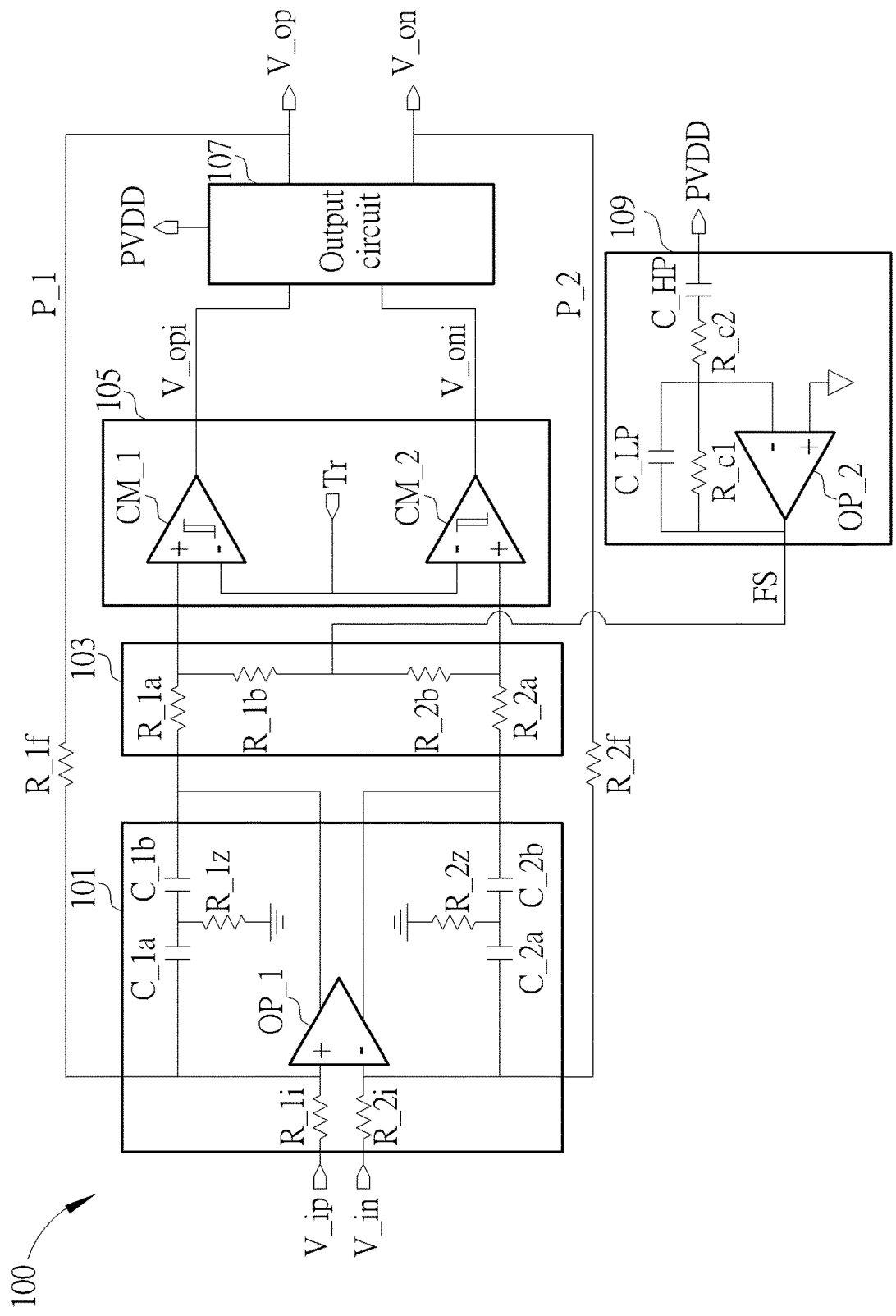

FIG. 3 and FIG. 4 are detail circuit diagrams of the class-D amplifier of FIG. 1, according to different embodiments of the present invention. Please note, the circuits in FIG. 3 and FIG. 4 are only for example, but do not mean to limit the scope of the present invention. Any circuit which can reach the same function should also fall in the scope of the present invention.

In the embodiment of FIG. 3, the PWM circuit 105 comprises a first PWM input and a second PWM input. Also, the summing circuit 103 comprises amplifiers a_p1, a_p2, a_n1, a_n2, a first adder A_1 and a second adder A_2. Gains of the amplifiers a_p1, a_p2, a_n1, a_n2 may be equal to or larger than 1. Also, amplifiers a_p1 and a_n2 amplify the filtered signal FS, and amplifiers a_p2 and a_n1 amplify output signals of the loop filter 101. The first adder A_1 adds an amplified signal of the amplifier a_P1 and an amplified signal of the amplifier a_P2 to generate the common-mode level of the first input signal of the PWM circuit 105. The second adder A_2 adds an amplified signal of the amplifier a_n1 and an amplified signal of the amplifier a_n2 to produce the common-mode level of the second input signal of the PWM circuit 105. Therefore, the outputs of the adder A_1 and A_2 can reflect the variation from the filtered signal FS.

FIG. 4 is a more detail circuit of the circuit of the class-D amplifier 100 shown in FIG. 3, according to one embodiment of the present invention. As shown in FIG. 4, the loop filter 101 comprises resistors R_1i, R_2i, R_1z, R_2z, capacitors C_1a, C_1b, C_2a, C_2b, and an operational amplifier OP_1. Also, the summing circuit 103 comprises resistors R_1a, R_1b, R_2a, and R_2b. The PWM circuit 105 comprises comparators CM_1, CM_2, which respectively comprises negative input terminals for receiving the triangular wave signal Tr and positive input terminals for receiving the outputs from the summing circuit 103. The output circuit 107 can have various circuit structures which are known by persons skilled in the art, thus are omitted for brevity here. Further, the supply voltage filter 109 comprises an operational amplifier OP_2, resistors R_c1, R_c2 and capacitors C_LP, C_HP. Further, in the embodiment of FIG. 4, the feedback paths P_1, P_2 respectively comprise resistors R_1f and R_2f.

Figure 5:
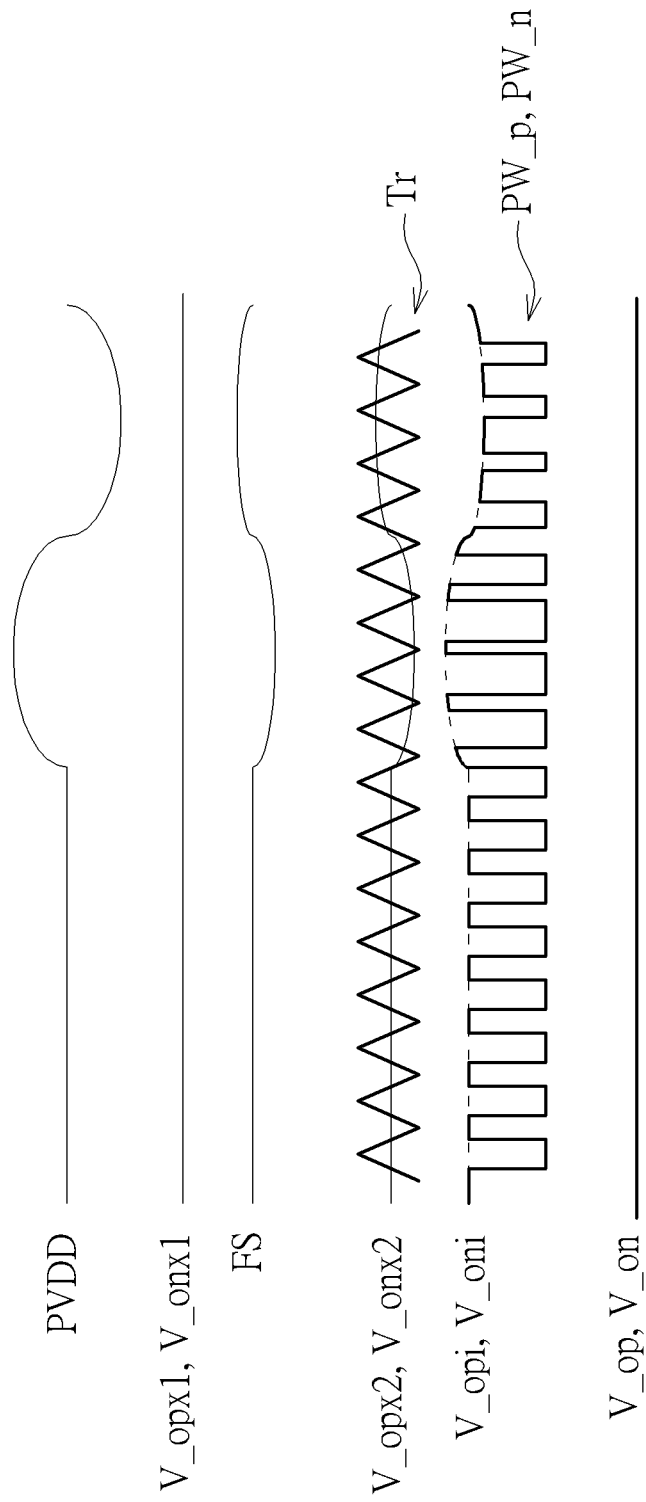
FIG. 5 is a wave chart of the class D amplifier of FIG. 4, according to one embodiment of the present invention.

FIG. 5 is a wave chart of the class D amplifier of FIG. 4, according to one embodiment of the present invention. In such embodiment, the supply voltage PVDD means the supply voltage received by the supply voltage filter 109 and the output circuit 107. The voltage V_opx1 means a voltage at the connection terminal of the capacitor C_1b and the resistor R_1a, and the voltage V_onx1 means a voltage at the connection terminal of the capacitor C_2b and the resistor R_2a. Additionally, the voltage V_opx2 means a voltage at the connection terminal of the resistors R_1a and R_1b and the voltage V_onx2 means a voltage at the connection terminal of the resistors R_2a and R_2b. Furthermore, the signals V_opi, V_oni mean the output signals which will be generated by the output circuit 107 without being processed (e.g. filtered) by the supply voltage filter 109. Furthermore, the output signals V_op, V_on mean the output signals generated by the output circuit 107 after being processed by the summing circuit 103 and the supply voltage filter 109.

As shown in FIG. 5, the supply voltage PVDD may have ripples, and part or all phases of the filtered signal FS are opposite to the supply voltage PVDD. Further, amplitudes of the filtered signal FS are proportional to the supply voltage PVDD. Besides, the PWM signals PW_p, PW_n are generated via processing the signals V_opx2, V_onx2 by the triangular wave signal TR. Since the signals V_opx2, V_onx2 vary corresponding to the filtered signals FS, the duty cycles of the PWM signals PW_p, PW_n also vary corresponding to the filtered signals FS. That is, duty cycles of the PWM signals PW_p, PW_n can vary corresponding to the ripple of the supply voltage PVDD. Therefore, the interference caused by the ripples of the supply voltage PVDD to the output signals V_op, V_on can be cancelled out since the duty cycles of the PWM signals PW_p, PW_n can vary corresponding to the ripples of the supply voltage PVDD.

Figure 6:
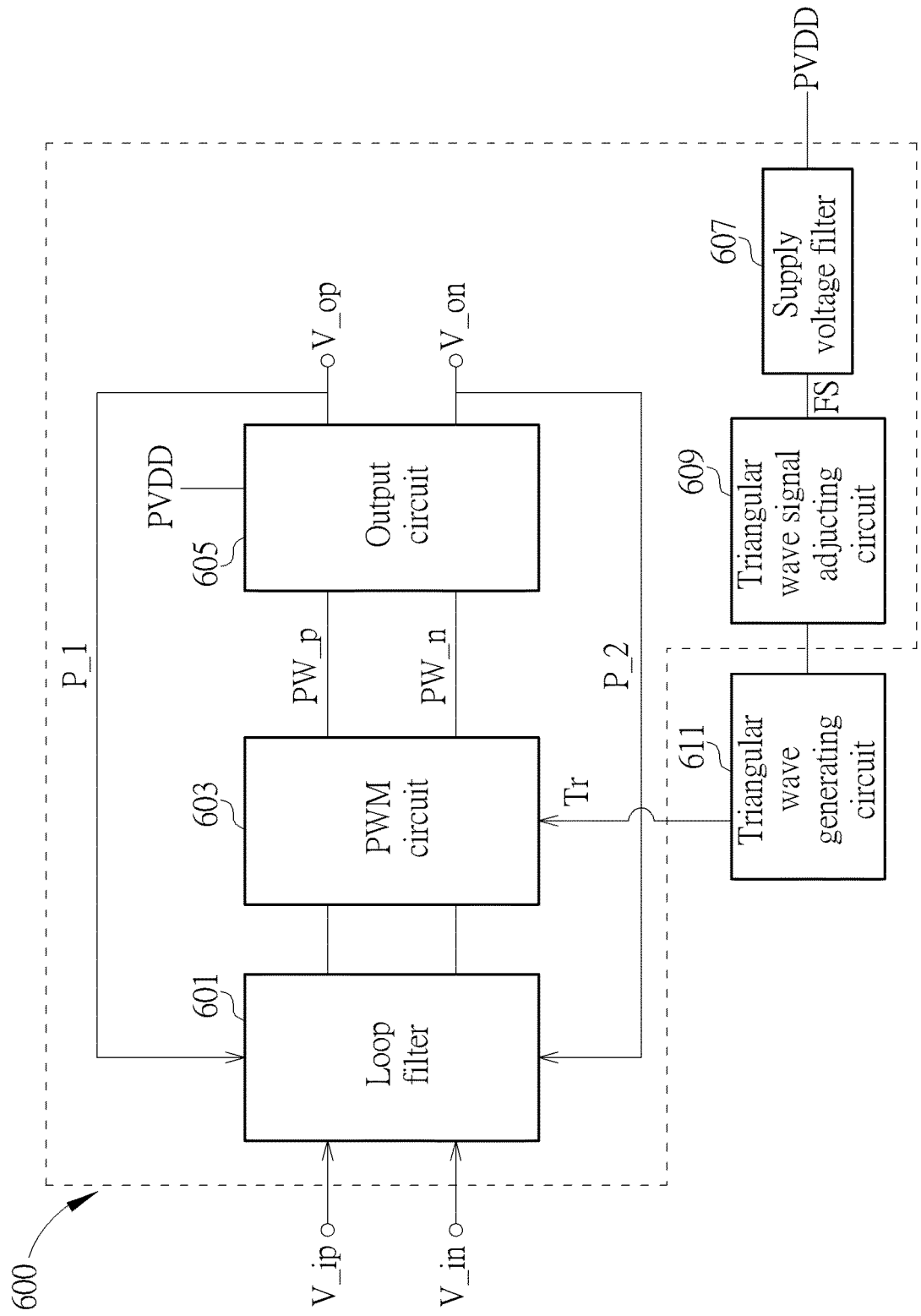
FIG. 6 is a block diagram illustrating a class-D amplifier according to another embodiment of the present invention.

Besides adjusting the common-mode level of the input signal of the PWM circuit 105, a common-mode level of the triangular wave signal can be adjusted to compensate the effect caused by ripples of the supply voltage PVDD, to achieve the same function. FIG. 6 is a block diagram illustrating a class-D amplifier according to another embodiment of the present invention. As shown in FIG. 6, the class-D amplifier 600 comprises a loop filter 601, a PWM circuit 603, an output circuit 605, a supply voltage filter 607, a triangular wave adjusting circuit 609. Also, the class-D amplifier 600 further comprises feedback paths P_1, P_2 located between the loop filter 601 and the output circuit 605. The loop filter 601, the PWM circuit 603, and the output circuit 605 may comprise circuit structures the same as which of the loop filter 101, the PWM circuit 105 and the output circuit 107 shown in FIG. 1.

The loop filter 601 is configured to receive the input signals V_ip, V_in. The PWM circuit 603 is coupled to output of the loop filter 601 and configured to generate PWM signal responding to a triangular wave signal Tr. The output circuit 605, which operates at a supply voltage PVDD, is configured to generate the output signals V_op, V_on responding to the PWM signals PW_p, PW_n. The supply voltage filter 607 is configured to monitor the supply voltage PVDD to generate a filtered signal FS. Besides, the triangular wave adjusting circuit 609 is configured to adjust a common mode level of the triangular wave signal Tr corresponding to the filtered signal FS. The triangular wave generating circuit 611 is configured to generate the triangular wave signal Tr.

The supply voltage filter 607 can be a band pass filter, as shown in FIG. 2. In one embodiment, the low pass cutoff frequency f L of the supply voltage filter 607 is lower than or equals an audio signal frequency (e.g. 20 Hz). Also, in one embodiment, a high pass cutoff frequency f_H of the supply voltage filter 607 depends on a modulation frequency of the PWM circuit 603. For example, the PWM circuit 603 modulates the output of the loop filter 601 to the PWM signals PW_p and PW_n responding to a clock signal having a modulation frequency fc, and the high pass cutoff frequency f_H is smaller than or equals $$\frac{fc}{10}.$$

That is, the high pass cutoff frequency f_H may be $$\frac{fc}{N},$$

N is a positive integer.

Figure 7:
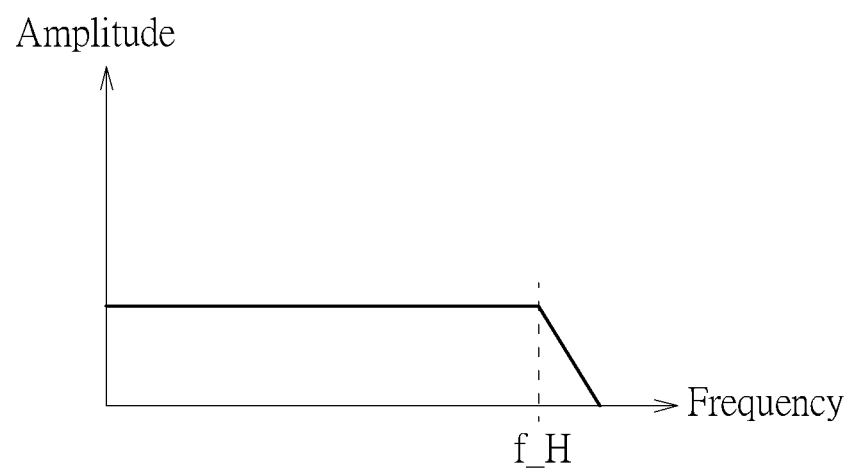
FIG. 7 is a schematic diagram illustrating the operation of the supply voltage filter of FIG. 6 according to one embodiment of the present invention.

Further, in another embodiment, the supply voltage filter 607 is a low pass filter, as shown in FIG. 7. A high pass cutoff frequency f_H of the supply voltage filter 607 is smaller than or equals a modulation frequency of the PWM circuit. In such case, the circuit of the supply voltage filter 607 can be designed to make sure the OP in the supply voltage filter 607 can receive a proper voltage. The details of the supply voltage filter 607 serving as a low pass filter will be described for more details later.

Figure 8:
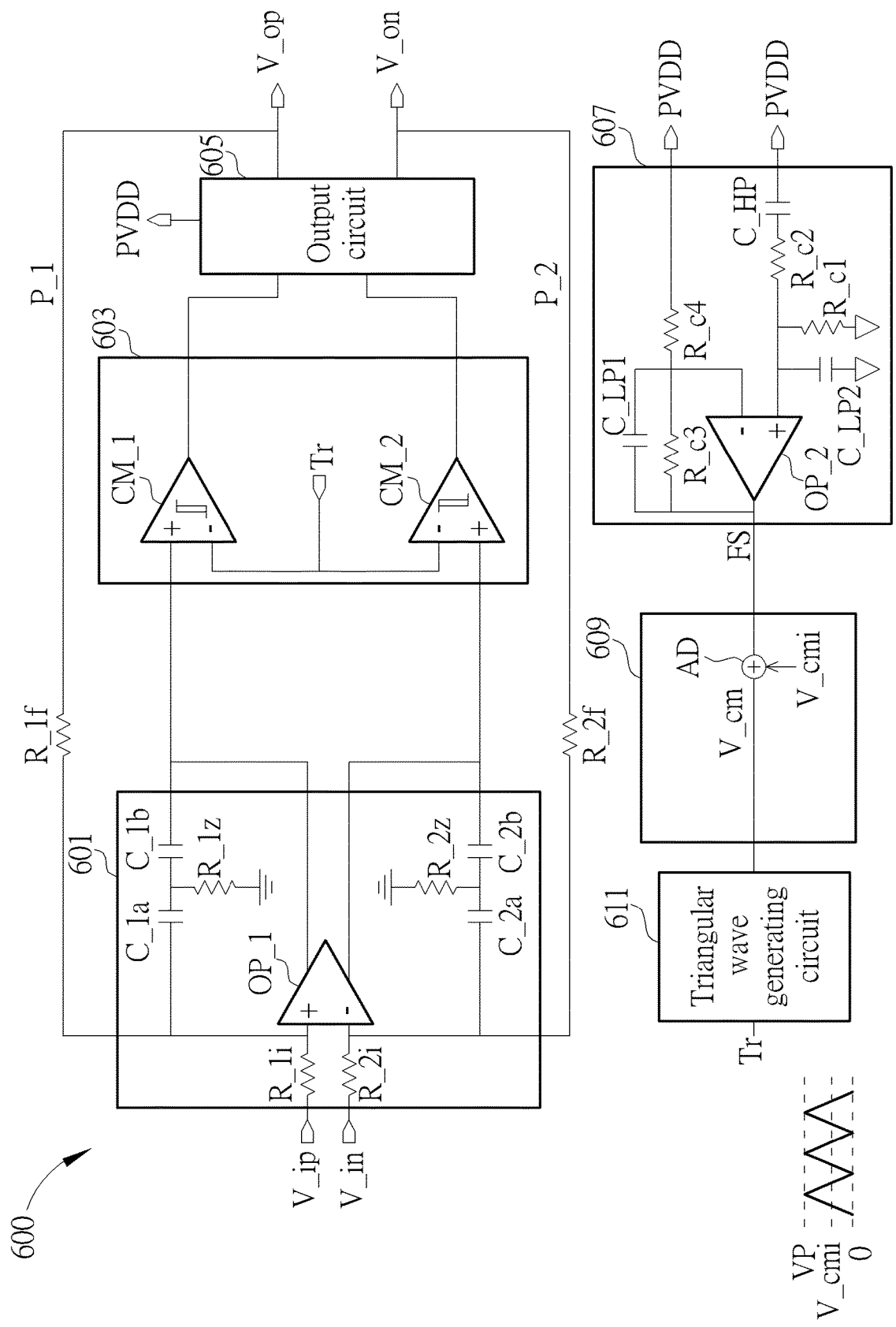
FIG. 8 and FIG. 9 are detail circuit diagrams of the class-D amplifier of FIG. 6, according to different embodiments of the present invention.
Figure 9:
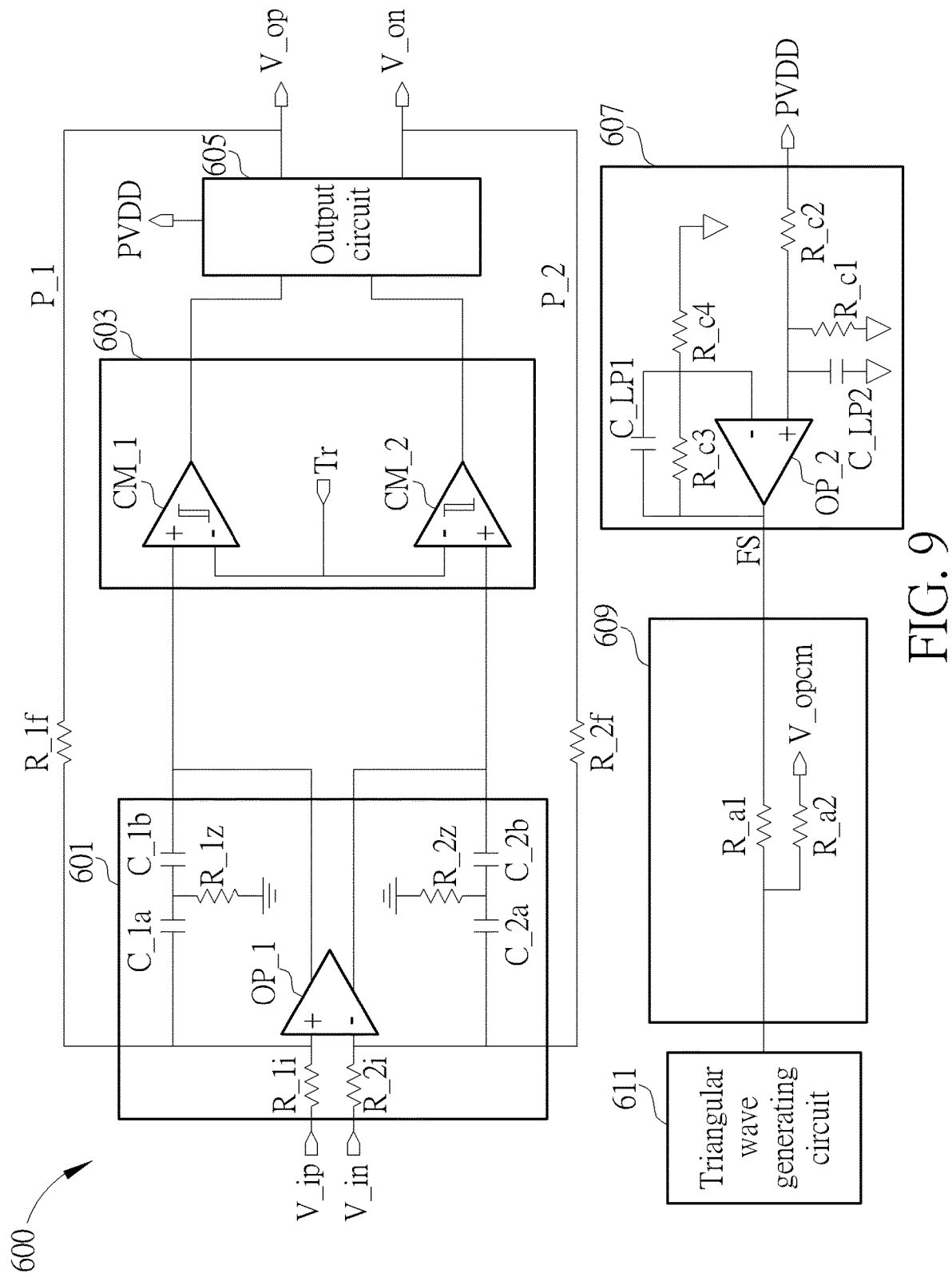

FIG. 8 and FIG. 9 are detail circuit diagram of the class-D amplifier of FIG. 6, according to different embodiments of the present invention. Please note, the circuits in FIG. 8 and FIG. 9 are only for example, but do not mean to limit the scope of the present invention. Any circuit which can reach the same function should also fall in the scope of the present invention. The supply voltage filter 607 is a band pass filter in the embodiment of FIG. 8 and is a low pass filter in the embodiment of FIG. 9.

In the embodiment of FIG. 8, the loop filter 601 comprises resistors R_1i, R_2i, R_1z, R_2z, capacitors C_1a, C_1b, C_2a, C_2b, and an operational amplifier OP_1. The PWM circuit 603 comprises comparators CM_1, CM_2, which respectively comprises negative input terminals for receiving the triangular wave signal Tr and positive input terminals for receiving the output from the loop filter 601. The output circuit 605 can have various circuit structures which are known by persons skilled in the art, thus are omitted for brevity here. Further, the supply voltage filter 607 comprises an operational amplifier OP_2, resistors R_c1, R_c2, R_c3, R_c4, and capacitors C_LP1, C_LP2, C_HP. Additionally, in such case, amplitudes of the filtered signal FS are proportional to the amplitudes of the supply voltage PVDD, and the phases of the filtered signals FS are proportional to the phases of the supply voltage rather than opposite.

Further, in the embodiment of FIG. 8, the triangular wave adjusting circuit 609 comprises an adder AD, which sums an initial common-mode level of the triangular wave signal Tr with the filtered signal FS, to generate a current common-mode level of the triangular wave signal Tr to the PWM circuit 603. In this embodiment, the initial common-mode level of the triangular wave signal (V_cmi) is set by ½VP, and the signal V_cm is the sum of the initial common-mode level V_cmi and the filtered signal FS. Therefore, a phase of the signal V_cm is proportional to the phase of the supply voltage PVDD. If a positive ripple of the supply voltage PVDD increases, the signal V_cm also increases, so that the triangular wave signal Tr is moved upwards. By this way, duties of the PWM signals PW_p, PW_n correspondingly decreases, to cancel out the effect caused by the positive ripple of the supply voltage PVDD.

In the embodiment of FIG. 9, the supply voltage filter 607 does not comprise the capacitor C_HP shown in FIG. 8. Therefore, the supply voltage filter 607 is a low pass filter rather than a band pass filter. In such case, the output voltage of the operation amplifier OP_2 equals to $$\frac{R\_c1}{R\_c2} \times PVDD.$$

The output voltage of the operation amplifier OP_2 in this embodiment is selected to be a current common-mode level of the triangular wave signal Tr. Therefore, if the voltage swing of the triangular wave signal Tr is Vp, the ratio $$\frac{R\_c1}{R\_c2}$$

can be selected to produce a voltage Vp/2. That is, the output voltage of the low pass filter 607 is used to set up a common-mode level of the triangular wave signal Tr. Besides, in some cases the power noise cancellation gain from the supply voltage PVDD to the PWM circuit 603 may be smaller than the ratio $$\frac{R\_c1}{R\_c2},$$

thus the triangular wave adjusting circuit 609 further comprises the resistor R_a2, which receives another voltage V_opcm (a set voltage). By this way, due to the voltage V_opcm, the common-mode level of the triangular wave signal Tr can be raised.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A class-D amplifier, configured to adjust at least one input signal to at least one output signal, comprising:
   a loop filter, configured to receive the input signal;
   a PWM circuit, coupled to the loop filter and configured to generate at least one PWM signal responding to a triangular wave signal;
   an output circuit operating at a supply voltage, configured to generate the output signal responding to the PWM signal;
   a supply voltage filter, configured to monitor the supply voltage to generate a filtered signal; and
   a triangular wave adjusting circuit, configured to adjust a common mode level of the triangular wave signal corresponding to the filtered signal.

2. The class-D amplifier of claim 1, wherein the supply voltage filter is a band pass filter.

3. The class-D amplifier of claim 2, wherein a low pass cutoff frequency of the supply voltage filter is lower than or equals an audio signal frequency.

4. The class-D amplifier of claim 2, wherein a high pass cutoff frequency of the supply voltage filter depends on a modulation frequency of the PWM circuit.

5. The class-D amplifier of claim 2, wherein amplitudes of the filtered signal are proportional to the supply voltage.

6. The class-D amplifier of claim 1, wherein the supply voltage filter is a low pass filter.

7. The class-D amplifier of claim 6, wherein a high pass cutoff frequency of the supply voltage filter is smaller than or equals a modulation frequency of the PWM circuit.

8. The class-D amplifier of claim 6, wherein the triangular wave adjusting circuit comprises:
   a first resistor, configured to receive the filtered signal to adjust the common mode level of the triangular wave signal; and a second resistor, coupled to receive a set voltage to adjust the common mode level of the triangular wave signal.

* * * * *